United States Patent
Umeda et al.

(10) Patent No.: US 6,954,089 B2
(45) Date of Patent: Oct. 11, 2005

(54) FREQUENCY CONVERTER HAVING LOW SUPPLY VOLTAGE

(75) Inventors: Toshiyuki Umeda, Inagi (JP); Shoji Otaka, Yokohama (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/776,199

(22) Filed: Feb. 12, 2004

(65) Prior Publication Data

US 2004/0160246 A1 Aug. 19, 2004

Related U.S. Application Data

(63) Continuation of application No. 10/207,024, filed on Jul. 30, 2002.

(30) Foreign Application Priority Data

Sep. 4, 2001 (JP) ........................................ 2001-266647
Jul. 19, 2002 (JP) ........................................ 2002-210565

(51) Int. Cl.$^7$ ............................................. H03B 19/00
(52) U.S. Cl. .................................... 327/113; 455/313
(58) Field of Search .................................. 327/100–103, 327/113, 355, 361, 359; 455/313–316, 318, 323, 190.1

(56) References Cited

U.S. PATENT DOCUMENTS

| 5,570,056 A | 10/1996 | Groe ........................... 327/359 |
| 5,634,207 A | 5/1997 | Yamaji et al. ............... 455/323 |
| 5,715,532 A | 2/1998 | Sagawa et al. .............. 455/333 |
| 5,760,632 A * | 6/1998 | Kawakami et al. .......... 327/355 |
| 5,767,705 A | 6/1998 | Ichinoi et al. ............... 327/113 |
| 5,995,819 A | 11/1999 | Yamaji et al. ............... 455/326 |
| 6,057,714 A | 5/2000 | Andrys et al. ............... 327/105 |
| 6,477,360 B1 | 11/2002 | Watanabe et al. ........... 455/318 |

FOREIGN PATENT DOCUMENTS

| CN | 1245597 | 2/2000 |
| EP | 0 488 257 | 6/1992 |
| EP | 0 903 846 | 3/1999 |

OTHER PUBLICATIONS

Toshiyuki Umeda, et al. "A 1V2GHz CMOS Up–Converter Using Self–Switching Mixers" ISSCC 2002 Digest of Technical Papers, Feb. 6, 2002, pp. 402–403.

* cited by examiner

*Primary Examiner*—Minh Nguyen
(74) *Attorney, Agent, or Firm*—Oblon, Spivak, McClelland, Maier & Neustadt, P.C.

(57) ABSTRACT

A frequency converter configured to convert a first current signal having a first frequency into a second current signal having a second frequency different from the first frequency is disclosed, which comprises an adder configured to add the first current signal and a predetermined reference current signal to output a third current signal corresponding to the sum of the first current signal and the reference current signal, and a switching circuit configured to pass only that portion of the third current signal which is larger in magnitude than a threshold current to output the second current signal.

4 Claims, 10 Drawing Sheets

FREQUENCY CONVERTER HAVING LOW SUPPLY VOLTAGE

This application is based upon and claims the benefit of priority from the prior Japanese Patent Applications No. 2001-266647, filed Sep. 4, 2001; and No. 2002-210565, filed Jul. 19, 2002, and is a continuation of U.S. application Ser. No. 10/207,024, filed Jul. 30, 2002, the entire contents of which are incorporated herein by reference.

BACKGROUND OF THE INVENTION

1. Field of the Invention

The present invention relates to a radio-frequency wireless circuit and more specifically to a frequency converter for use with low supply voltages.

2. Description of the Related Art

Up to now, much progress has been made in microstructuring semiconductor devices including transistors. In particular, the gate length of transistors used in CMOS (complementary metal oxide semiconductor) devices has been shrunk to less than 0.1 μm. MOS transistors having a gate length of this order have a frequency characteristic which exhibits a very fast response and are therefore very useful devices for implementing next-generation radio-frequency communications systems.

As for bipolar transistors, a SiGe heterojunction-based transistor has been developed, which exhibits a fast response and high drivability and is also promising for next-generation radio-frequency communications systems.

These fast devices however attain high-speed performance at the cost of their ability to withstand high voltages. For example, with MOS transistors, reducing the gate length results in an improvement in high-speed performance but is accompanied by a reduction in the thickness of the gate oxide, thus degrading their breakdown characteristics. With bipolar transistors, on the other hand, reducing the thickness of the base region results in an improvement in their high-speed performance but accompanied by a degradation in their breakdown characteristics. With both MOS transistors and SiGe bipolar transistors, the breakdown voltage of devices that can realize high-frequency characteristics is lowered to values of the order of 1 to 2 V. Devices using circuit configurations adapted for a supply voltage of 3 V and hitherto used in radio communications systems may therefore be short of resistance-to-voltage capability. For this reason, the power consumption of the devices will increase. It is desirable that the power consumption of circuits particularly used in portable wireless terminals be as low as possible; otherwise, the conversation time of the terminals will be reduced considerably.

As described above, where use is made of high-speed transistors having low withstand voltages, it is required to set the circuit supply voltage lower than the withstand voltages of the transistors. To this end, it is required to devise a circuit configuration which is different from conventional ones and can be operated from a low supply voltage. In addition, to adapt to portable wireless terminals, it is necessary to reduce the power consumption of circuits used therein.

BRIEF SUMMARY OF THE INVENTION

It is an object of the present invention to provide a frequency converter which permits the supply voltage to be lowered below the withstand voltage of the fast transistors used and power consumption to be reduced.

According to a first aspect of the present invention, there is provided a frequency converter which converts a first current signal having a first frequency into a second current signal having a second frequency different from the first frequency, comprising: an adder which adds the first current signal and a predetermined reference current signal to output a third current signal including a current component which is larger in magnitude than a threshold current; and a switching circuit configured to pass only the current component of the third current signal to obtain the second current signal.

According to a second aspect of the present invention, there is provided a frequency converter which converts a first current signal having a first frequency into a second current signal having a second frequency different from the first frequency, comprising: a first adder which adds the first current signal and a predetermined reference current signal to output a third current signal including a current component which is larger in magnitude than a first threshold current; a second adder which adds a first antiphase current signal opposite in phase to the first current signal and a second antiphase current signal opposite in phase to the reference current signal to output a fourth current signal including a current component which is larger in magnitude than a second threshold current; a first current output circuit configured to pass only the current component of the third current signal to output a first passed current signal; a second current output circuit configured to pass only the current component of the fourth current signal to output a second passed current signal; and a third adder which adds the first passed current signal and the second passed current signal to output the second current signal.

According to a third aspect of the present invention, there is provided a frequency converter which converts a first current signal having a first frequency into a second current signal having a second frequency different from the first frequency, comprising: a first adder which adds the first current signal and a predetermined reference current signal to output a third current signal including a current component which is larger in magnitude than a first threshold current; a second adder which adds a first antiphase current signal opposite in phase to the first current signal and a second antiphase current signal opposite in phase to the reference current signal to output a fourth current signal including a current component which is larger in magnitude than a second threshold current; a third adder which adds a first phase-shifted current signal obtained by shifting a phase of the first current signal by 90 degrees and a second phase-shifted current signal obtained by shifting a phase of the reference current signal by 90 degrees to output a fifth current signal including a current component which is larger in magnitude than a third threshold current; a fourth adder which adds a third phase-shifted current signal obtained by shifting the phase of the first current signal by 270 degrees and a fourth phase-shifted current signal obtained by shifting the phase of the reference current signal by 270 degrees to output a sixth current signal including a current component which is larger in magnitude than a fourth threshold current; a first current output circuit configured to pass only the current component of the third current signal to output a first passed current signal; a second current output circuit configured to pass only the current component of the fourth current signal to output a second passed current signal; a third current output circuit configured to pass only that portion of the fifth current signal which is larger in magnitude than a third threshold current to output a third passed current signal; a fourth current output circuit configured to pass only the current component of the sixth current signal to output a fourth passed current signal; a fifth adder which adds the first passed current signal, the second passed current signal, the third passed current signal, and the fourth passed current signal to output the second current signal; a sixth adder which adds the first current signal and the second antiphase current signal to output a seventh current signal including a current component which is larger in magnitude than a fifth threshold current; a seventh adder which adds the first antiphase current signal and the reference current signal to output an eighth current signal including a current component which is larger in magnitude than a seventh threshold current; an eighth adder which adds the first phase-shifted current signal and the fourth phase-shifted current signal to output a ninth current signal including a current component which is larger in magnitude than a seventh threshold current; a ninth adder which adds the second phase-shifted current signal and the third phase-shifted current signal to output a tenth current signal including a current component which is larger in magnitude than an eighth threshold current; a fifth current output circuit configured to pass only the current component of the seventh current signal to output a fifth passed current signal; a sixth current output circuit (134-3) configured to pass only the current component of the eighth current signal to output a sixth passed current signal; a seventh current output circuit (152-4) configured to pass only the current component of the eighth current signal to output a seventh passed current signal; an eighth current output circuit (152-3) configured to pass only the current component of the tenth current signal to output an eighth passed current signal; and a tenth adder (135-2) which adds the fifth passed current signal, the sixth passed current signal, the seventh passed current signal, and the eighth passed current signal to output a third antiphase current signal opposite in phase to the second current signal.

DETAILED DESCRIPTION OF THE INVENTION

Hereinafter, each of the preferred embodiments of the present invention will be described in sequence with reference to the accompanying drawings.

[First Embodiment]

Figure 1:
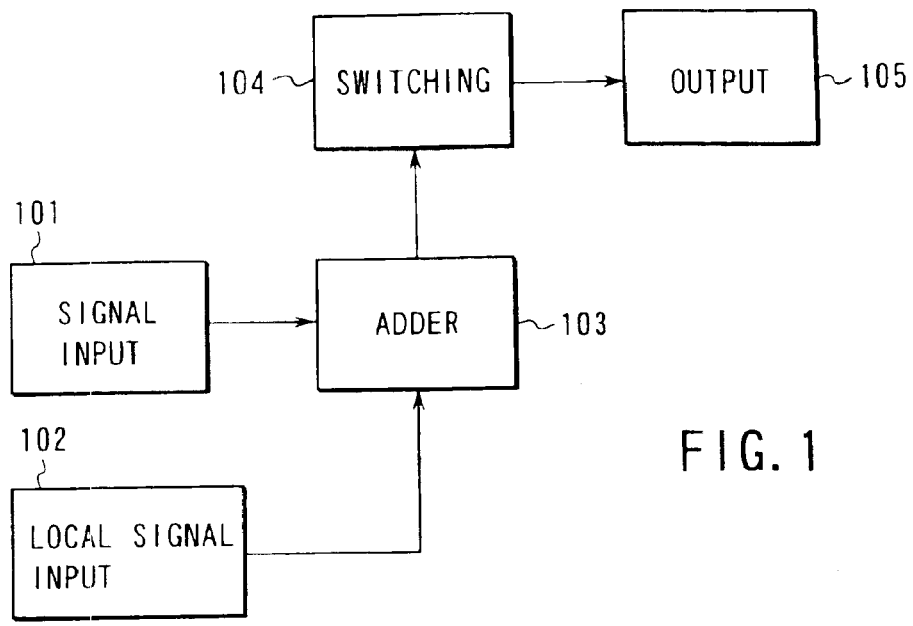
FIG. 1 is a block diagram of a frequency converter according to a first embodiment of the present invention.

Referring now to the frequency converter of FIG. 1, a signal input circuit 101 inputs an intermediate frequency (IF) signal in the case where the frequency converter is an up-converter or a radio frequency (RF) signal in the case where the frequency converter is a down-converter. A local signal input circuit 102, which is comprised of a local oscillator, inputs a local (LO) signal. Each of the signal input circuit 101 and the local signal input circuit 102 is comprised of a transconductor, i.e., a voltage-to-current converter, constructed from a MOS transistor by way of example. A signal adder 103 adds the input signal from the signal input circuit 101 and the LO signal from the local signal input circuit 102 and outputs the sum signal to a switching circuit 104.

The switching circuit 104 performs a switching operation so as to pass that portion of the current waveform of the sum signal which is larger in magnitude than a threshold current and block the other. An output signal of the switching circuit 104 contains a signal resulting from frequency conversion of an IF current signal with an LO current signal. A signal output circuit 105 includes a filter to remove unwanted signals from the output signal of the switching section 104 and mainly outputs a signal in the RF band in the case of an up-converter or a signal in the IF band in the case of a down-converter.

Using FIG. 2, a specific configuration of the switching circuit 104 of FIG. 1 will be described taking an up-converter (the IF signal is frequency converted by the LO signal to produce an RF signal) as an example. The switching circuit 104 uses an n-channel MOS transistor M1 the gate terminal of which is grounded to provide a low-impedance path for radio-frequency currents. Here, the grounding for radio-frequency currents refers to the connection of a grounding point to a point where impedance is zero and includes connection to ground potential and connection to the supply voltage (Vdd).

The source terminal of the transistor M1 is connected to receive the sum signal of the IF current signal and the LO current signal from the signal adder 103. The source terminal of the transistor M1 is also connected to a constant current source 106. The value of the constant current I1 produced by the constant current source 106 is substantially equal to the value of a threshold current Ith, which is set equal to the sum of the bias current of the IF current signal and the bias current of the LO current signal. The transistor M1 passes only a portion of the waveform of the sum current signal which is larger in magnitude than the threshold current Ith to thereby produce a modulated signal (RF signal). The resulting modulated signal is output from the source terminal of the transistor M1 to the signal output circuit 105.

The role of the threshold current Ith will be described below. The sum current signal ($I_S+I_L$) of the IF current signal $I_S$ and the LO current signal $I_L$ is connected to the source of the transistor M1, which is connected to the constant current source 106 that determines the threshold current Ith. With $I_S+I_L \leq$ Ith, therefore, $I_S+I_L$ is blocked by Ith with the result that it does not flow to the source terminal of the transistor M1. With $I_S+I_L>$ Ith, on the other hand, a current of ($I_S+I_L$) minus Ith is allowed to flow to the source of the transistor M1.

Figure 2:
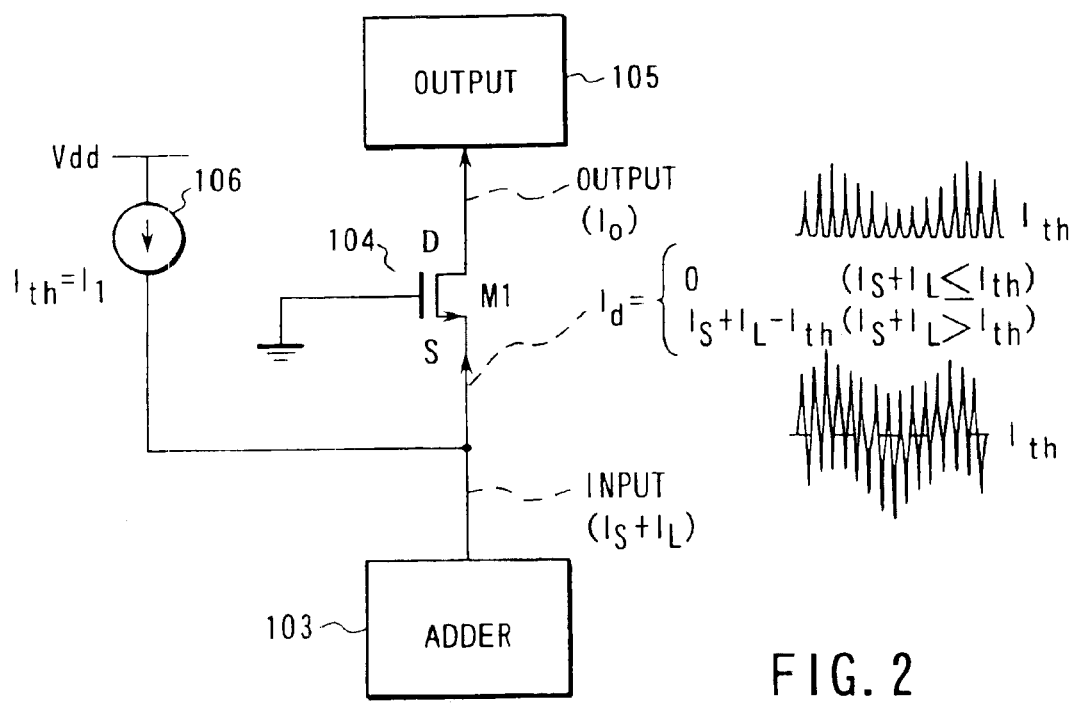
FIG. 2 shows a specific example of the switching circuit in FIG. 1.

This will be understood from current waveforms as shown in FIG. 2. That is, the sum current signal ($I_S+I_L$) of the IF current signal $I_S$ and the LO current signal $I_L$ is input to the source terminal of the transistor M1. The transistor M1 performs a switching operation so as to pass components of the input signal which are larger in magnitude than the threshold signal and block components smaller in magnitude. Thus, the waveform of a current signal (Io) output from the drain terminal of the transistor M1 corresponds to only the upper half of the waveform of the input current signal ($I_S+I_L$). Here, the output current signal Io contains a frequency-converted RF signal component. Unwanted components are removed from the output current signal Io by the signal output circuit 105 so that only the RF signal component is taken. Note here that the IF current signal $I_S$ contains a constant bias current in addition to an alternating-current signal current component. Likewise, the LO current signal $I_L$ also contains a constant bias current in addition to an alternating-current signal current component.

In what follows, in terms of mathematical expressions we will explain the reason why the RF signal component appears in the output current signal Io. Let the signal current component in the IF current signal be $i_S$ and the signal current component in the LO current signal be $i_L$. In general, $i_L$ is sufficiently large in amplitude compared with $i_S$; therefore, the frequency at which the transistor M1 is switched on and off depends on the angular frequency of $i_L$. Thus, if $i_S$ and $i_L$ are represented by $$i_S = A \sin \omega_S t \qquad (1\text{—}1)$$

$$i_L = B \sin \omega_L t \qquad (1\text{-}2)$$

then the modulated signal component io can be represented by $$io = (i_S + i_L) \times C(\sin \omega_L t + \tfrac{1}{3} \sin 3\omega_L t + \ldots) \qquad (2)$$

where A, B and C are constants, $\omega_S$ and $\omega_L$ are angular frequencies of the signal current components $i_S$ and $i_L$, respectively, and t is the time. Neglecting higher-order terms in equation (2) and reducing it, we obtain $$io = AC \sin \omega_S t \sin \omega_L t + BC \sin^2 \omega_L t \qquad (3)$$

In equation (3), the first term is the modulated term. It can therefore been seen that a frequency converter is implemented by allowing the transistor M1 to be switched on and off by the LO current signal.

[Second Embodiment]

Figure 3:
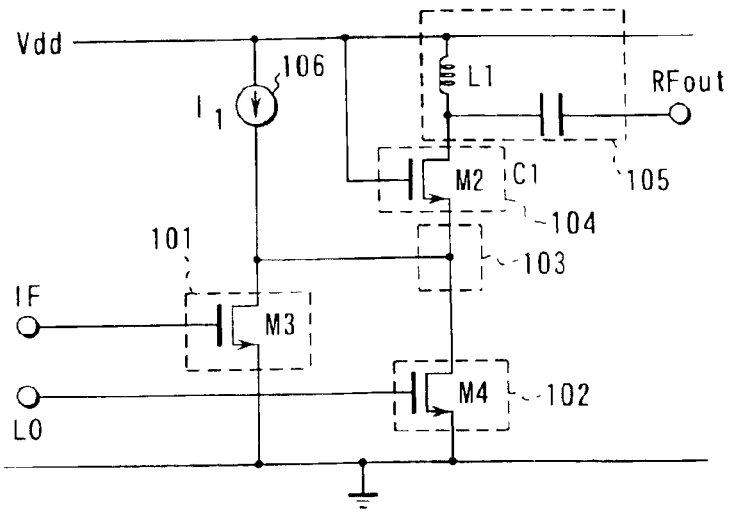
FIG. 3 shows a circuit configuration of a frequency converter according to a second embodiment of the present invention.

Referring now to FIG. 3, there is shown a frequency converter acting as an up-converter according to a second embodiment of the present invention. Transistors M2, M3 and M4 shown in FIG. 3 are all nMOS (n-channel MOS) transistors. The transistor M3 corresponds to the signal input circuit 101. An IF signal is applied to the gate terminal of the transistor M3 where it is subjected to voltage-to-current conversion to form an IF current signal. The transistor M4 corresponds to the local signal input circuit 102. An LO signal is applied to the gate terminal of the transistor M4 by which it is voltage-to-current converted into an LO current signal. Though not shown, each of the transistors M3 and M4 has its gate terminal supplied with a bias voltage so that an appropriate bias current will flow in it. The constant current source 106 supplies a current substantially equal to the bias current to the drain terminal of each of the transistors M3 and M4. The connection point of the drain terminals of the transistors M3 and M4, which corresponds to the signal adder 103, is connected to the source terminal of the transistor M2. The transistor M2 corresponds to the switching circuit 104. An inductor L1 and a capacitor C1 form a filter corresponding to the signal output circuit 105.

Next, a description is given of the supply voltage Vdd needed for the circuit of FIG. 3. The gate terminal of the transistor M2 is grounded for radio-frequency currents but connected to the supply voltage Vdd for direct currents. Assuming here the supply voltage Vdd to be 1 V, the gate-to-source voltage Vgs of the transistor M2 becomes substantially equal to the threshold voltage Vth, which is of the order of 0.5 to 0.7 V. The constant current source 106 has a current value of, say, 10 mA. Thus, the source potential of the transistor M2, that is, the drain potential of the transistors M3 and M4, is in the range of 0.3 to 0.5 V. By biasing their gates at about Vth+0.2 V, the transistors M3 and M4 are allowed to operate in the saturation region, i.e., in the region in which Vds>Vgs−Vth where Vds is the drain-to-source voltage. In the frequency converter of FIG. 3, therefore, the stage in which the transistors M2 and M4 are stacked in series is allowed to operate with supply voltage Vdd=1 V. For this reason, this frequency converter can be operated from supply voltages lower than the conventional supply voltage (=3 V), thus allowing adverse influence on the voltage resistance of the transistors to be excluded and power consumption to be reduced.

[Third Embodiment]

A frequency converter acting as an up-converter according to a third embodiment of the present invention will now be described with reference to FIG. 4. This frequency converter is different from the circuit shown in FIG. 3 in that the transistor adapted to convert an IF voltage signal into an IF current signal is changed from the nMOS transistor M3 to a pMOS (p-channel MOS) transistor M6 and the constant current source 106 is removed. In this case, a current signal corresponding to $I_I - I_{IF}$ flows out of the drain terminal of the transistor M6. Transistors M7 and M5, an inductor L2 and a capacitor C2 in FIG. 4 correspond to M4, M2, L1 and C1, respectively, in FIG. 3. An IF voltage signal is applied to the gate terminal of the transistor M6 for conversion into an IF current signal. Each of the transistors M6 and M7 has its gate terminal biased so that an appropriate bias current will flow in it. Since the transistor M6 is a pMOS transistor and the transistor M7 is an nMOS transistor, making the bias current in M6 and the bias current in M7 substantially equal to each other allows the constant current source 106 to be removed.

Figure 4:
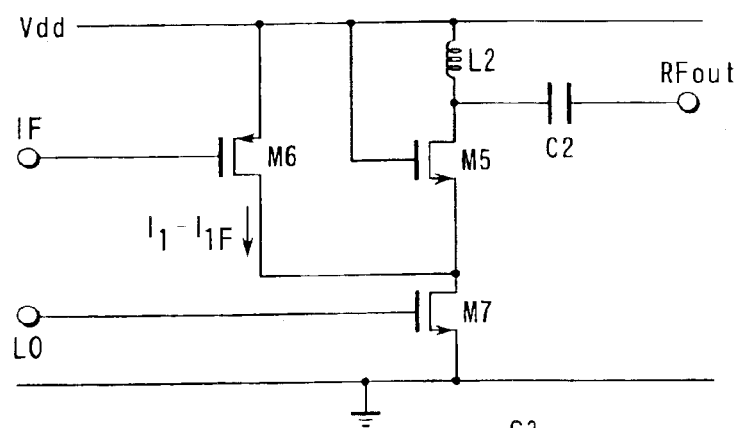
FIG. 4 shows a circuit configuration of a frequency converter according to a third embodiment of the present invention.

Next, a description is given of the supply voltage Vdd needed for the circuit of FIG. 4. Assuming here the supply voltage Vdd to be 1 V, the gate-to-source voltage Vgs of the transistor M5 becomes substantially equal to the threshold voltage Vth, which is of the order of 0.5 to 0.7 V. Thus, the source potential of the transistor M5, that is, the drain potential of the transistors M6 and M7, is in the range of 0.3 to 0.5 V. By biasing the gates of the transistors M6 and M7 at about Vth−0.2 V and Vth+0.2 V, respectively, they are allowed to operate in the saturation region. In the frequency converter of FIG. 4, therefore, the stage in which the transistors M5 and M7 are stacked in series is allowed to operate with supply voltage Vdd=1 V. For this reason, this frequency converter can be operated from supply voltages lower than the conventional supply voltage (=3 V), thus allowing adverse influence on the voltage resistance of the transistors to be excluded. In addition, the circuit configuration of FIG. 4 eliminates the need for a constant current source and hence can effect a more significant reduction in power consumption than the circuit configuration of FIG. 3.

[Fourth Embodiment]

Figure 5:
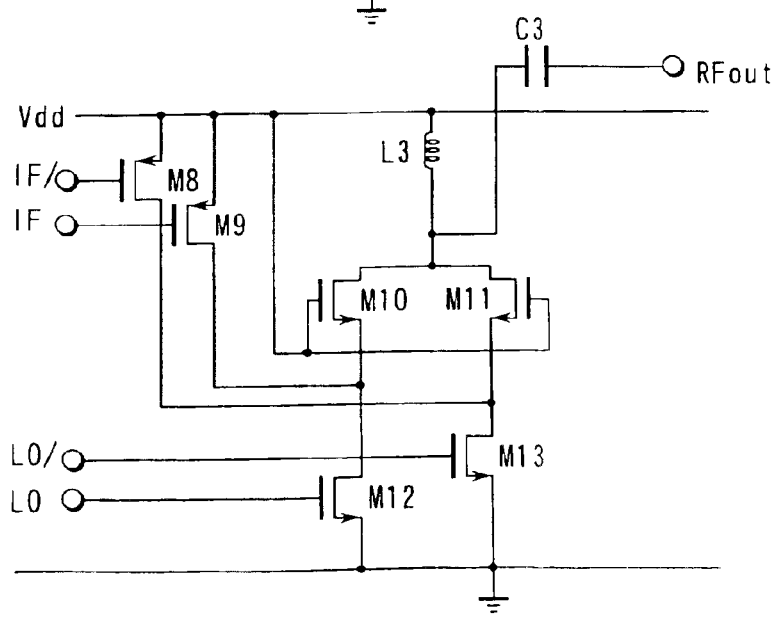
FIG. 5 shows a circuit configuration of a frequency converter according to a fourth embodiment of the present invention.

A frequency converter acting as an up-converter according to a fourth embodiment of the present invention will now be described with reference to FIG. 5. FIG. 5 shows a circuit configuration corresponding to the circuit of FIG. 4 and adapted for differential IF signals (IF, IF/) and differential LO signals (LO, LO/). Transistors M12, M10 and M9 correspond to the transistors M7, M5 and M6, respectively, of FIG. 4 for the IF signal and transistors M13, M11 and M8 correspond to the transistors M7, M5 and M6, respectively, for the IF/signal opposite in phase to the IF signal. An inductor L3 corresponds to the inductor L2 and a capacitor C3 corresponds to the capacitor C2.

The configuration of FIG. 5 allows the modulated signal which is output to the signal output circuit comprised of the inductor L3 and the capacitor C3 to be doubled in amplitude. The LO signal in the modulated signal is canceled at the output signal adder (the point at which the drain terminals of the transistors M10 and M11 are connected together) and becomes, in principle, zero.

[Fifth Embodiment]

Figure 6:
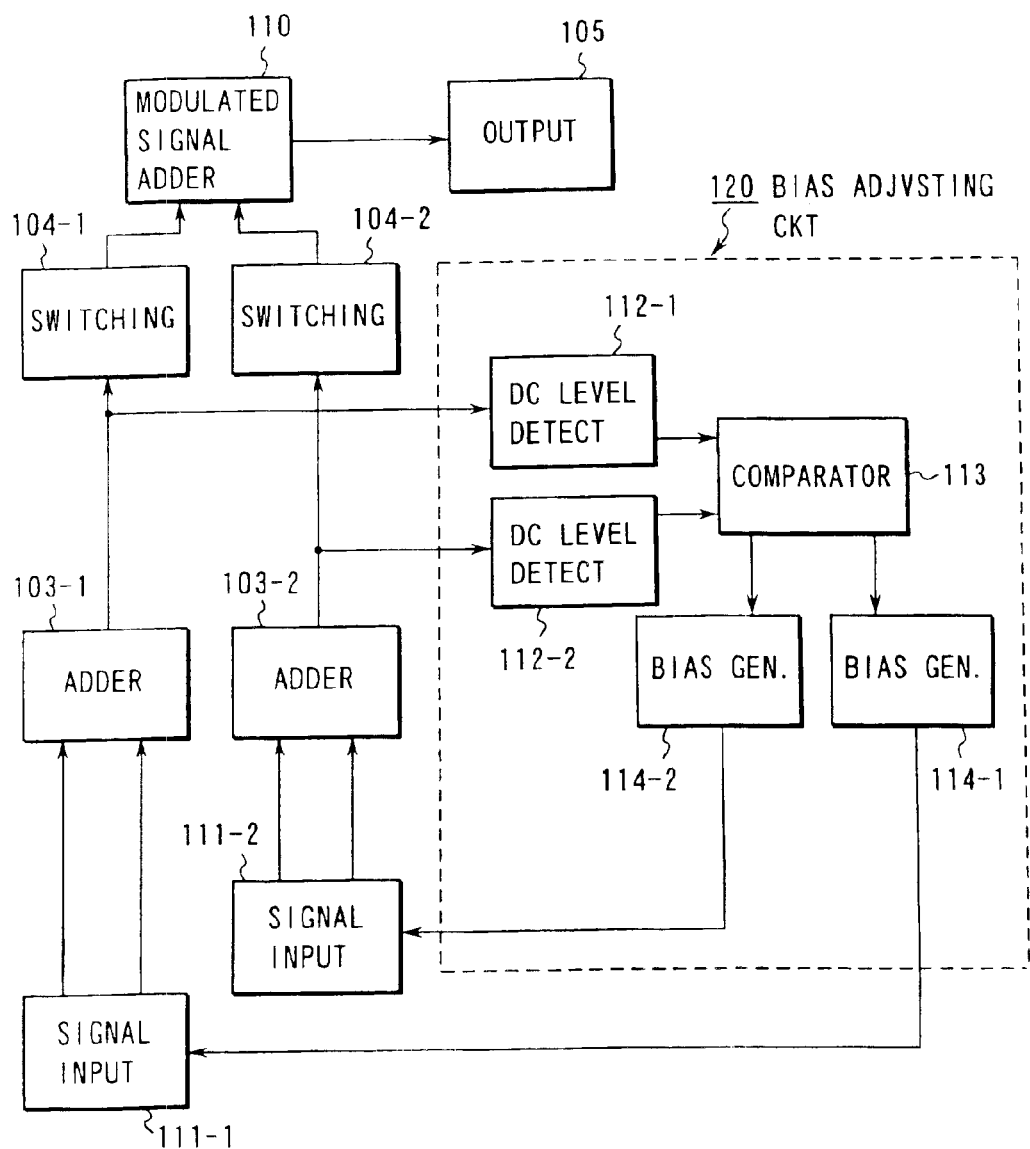
FIG. 6 is a block diagram of a frequency converter according to a fifth embodiment of the present invention.

A frequency converter according to a fifth embodiment of the present invention will now be described with reference to FIG. 6, which shows a circuit configuration and a bias supply method at the time the differential IF signals and the differential LO signals are input. The IF and LO signals are input to a signal input circuit 111-1 and then added in a signal adder 103-1. The resulting sum signal is input to a switching circuit 104-1, which passes only a portion of the input sum signal which is larger in amplitude than a threshold value to one of input terminals of a modulated signal adder 110.

The IF/ and LO/signals, which are respectively opposite in phase to the IF and LO signals, are input to a signal input circuit 111-2 and then added together in a signal adder 103-2. The resulting sum signal is input to a switching circuit 104-2, which passes only a portion of the input sum signal which is larger in amplitude than a threshold current value to the other input terminal of the modulated signal adder 110.

The modulated signal adder 110 adds the outputs of the respective switching circuits 104-1 and 104-2 and outputs the resulting sum signal to a signal output circuit 105.

A bias level adjusting circuit 120 comprises DC level detectors 112-1 and 112-1 and bias generators 114-1 and 114-2. The DC level detector 112-1 detects the direct current (DC) level of the output of the signal adder 103-1 and the DC level detector 112-1 detects the DC level of the output of the signal adder 103-2. A level comparator 113 makes a comparison between DC levels detected by the DC level detectors 112-1 and 112-2. The bias generator 114-1 determines a is bias level for the signal input circuit 111-1 on the basis of the result of comparison by the level comparator 113. Likewise, the bias generator 114-2 determines a bias level for the signal input circuit 111-2 on the basis of the result of comparison by the level comparator 113.

The fifth embodiment configured as described above makes allowance for variations from transistor to transistor. That is, the bias level adjusting circuit 120 detects variations in level between the differential signals due to variations from transistor to transistor to produce biases in a direction to compensate for the variations. Thus, it becomes possible to prevent unwanted signals from being output, i.e., to prevent the LO signal from leaking.

[Sixth Embodiment]

Figure 7:
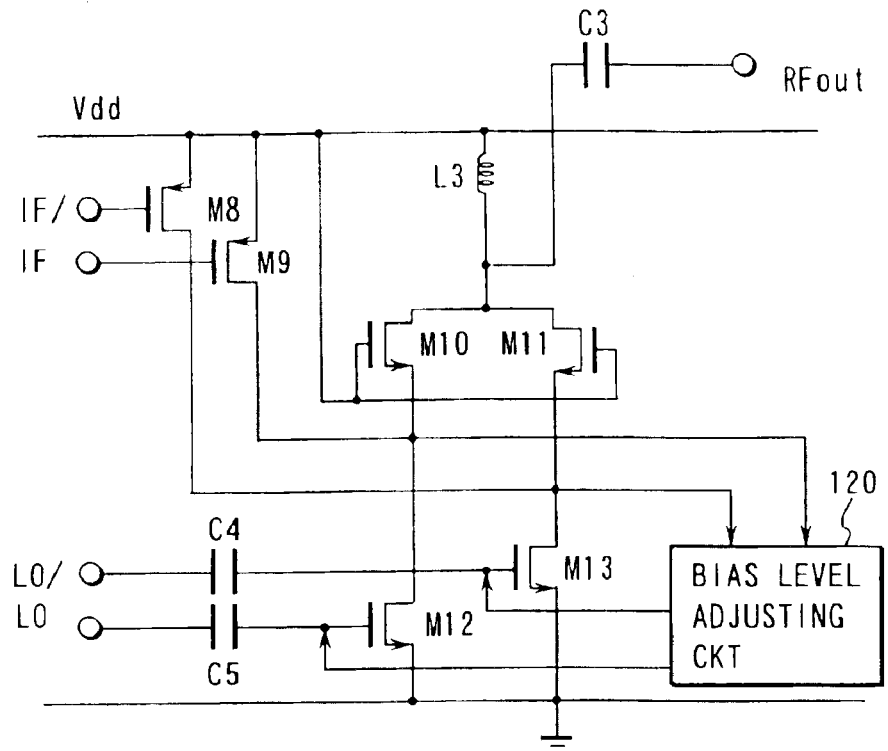
FIG. 7 shows a circuit configuration of a frequency converter according to a sixth embodiment of the present invention.

A frequency converter according to a sixth embodiment of the present invention will now be described with reference to FIG. 7.

That is, the transistors M10 and M11 have their source terminals connected to the inputs of the bias level adjusting circuit 120. The transistors M12 and M13 have their gate terminals connected to the outputs of the bias level adjusting circuit 120 to receive biases produced by the circuit 120. Note here that capacitors C4 and C5 are provided to prevent the biases produced by the bias level adjusting circuit 120 from being conducted to the LO and LO/terminals.

[Seventh Embodiment]

A frequency converter according to a seventh embodiment of the present invention will now be described with reference to FIG. 8, which particularly shows a specific circuit configuration of the bias level adjusting circuit 120. The circuit configuration of FIG. 8 other than the bias level adjusting circuit 120 remains unchanged from the circuit configuration of FIG. 5. The transistors M10 and M11 have their source terminals connected through resistors R1 and R2 to the gate terminals of transistors M27 and M28, respectively. The resistors R1 and R2, which are adapted to interrupt radio frequency signals, detect the DC bias levels of the input signals to the transistors M10 and M11. The transistors M27 and M28 form a differential amplifier of which the bias current value is determined by a constant current I2 of a constant current source 107.

The transistors M27 and M28, corresponding to the level comparator 113, make a comparison between the DC bias levels detected by the resistors R1 and R2 to present the result of comparison to transistors M25 and M26. The transistor M25 forms a current mirror acting as the bias generator 114 together with a transistor M23. Likewise, the transistor M26 forms a current mirror together with a transistor M21. Thus, the output current of the transistor M23 is conducted to a transistor M24 and the output current of the transistor M21 is conducted to a transistor M22. The transistors M24 and M12 form a current mirror. Likewise, the transistors M22 and M13 form a current mirror.

Thus, the currents flowing in the transistors M12 and M13 are allotted by the transistors M27 and M28 with reference to half of the current value determined by the constant current source 107. Resistors R3 and R4 are adapted to interrupt high-frequency signals. A reference potential is used as the gate potential of each of the transistors M21, M22, M25, M26, M27, and M28. For this reason, these transistors are allowed to be larger in gate length than other transistors, which allows variations due to errors made in manufacturing the gates to be suppressed.

Figure 8:
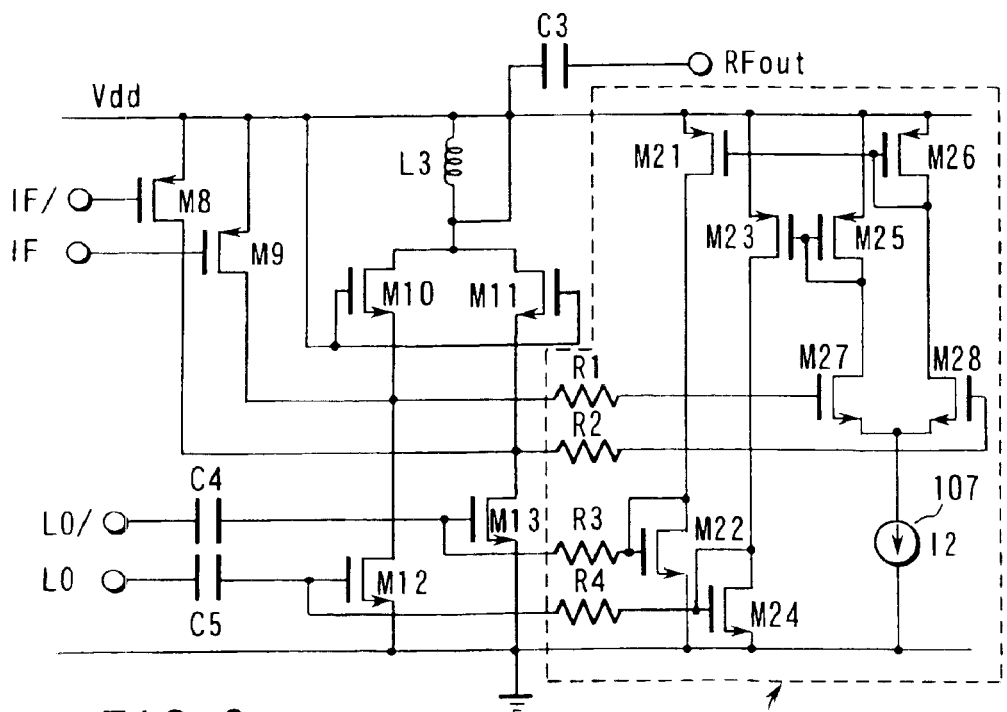
FIG. 8 shows a circuit configuration of a frequency converter according to a seventh embodiment of the present invention.

The use of such a biasing scheme as shown in FIG. 8 allows the supply of constant biases irrespective of the supply voltage of the circuit.

Figure 9:
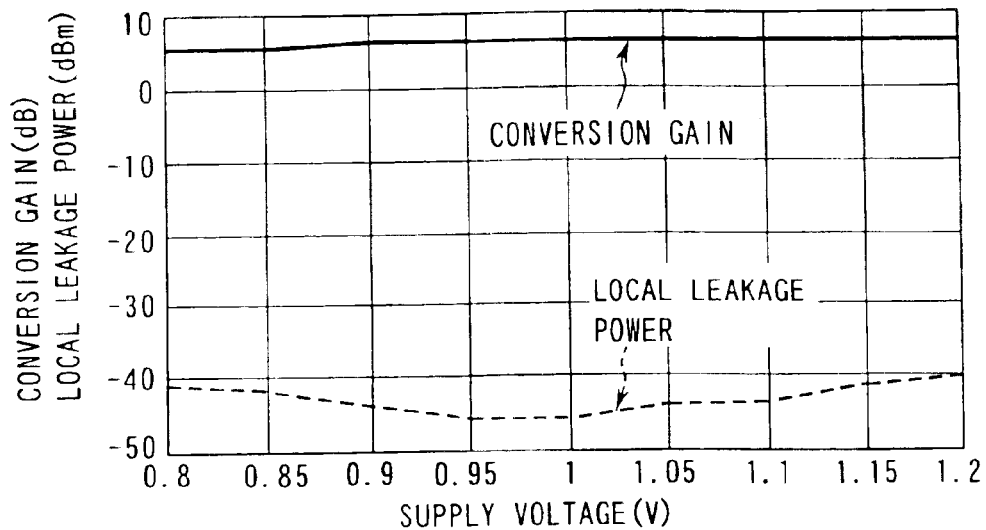
FIG. 9 shows plots of the gain and the adjacent channel leakage power versus the supply voltage.

FIG. 9 shows the characteristics of the circuit configuration of FIG. 8. This circuit is a transmitting frequency converter that operates in the radio-frequency band 2 GHz. The characteristics indicate the measurements of the conversion gain and the local leakage power with the circuit supply voltage Vdd changed from 0.8 to 1.2 V. The input IF signal power is −29 dBm. The conversion gain makes little change and is kept at about +6 dB. The local leakage power changes by about 6 dB but is kept below −40 dBm. From these characteristics it can be seen-that the frequency converter of FIG. 8 will operate even with a low supply voltage of about 1 V.

[Eighth Embodiment]

Figure 10:
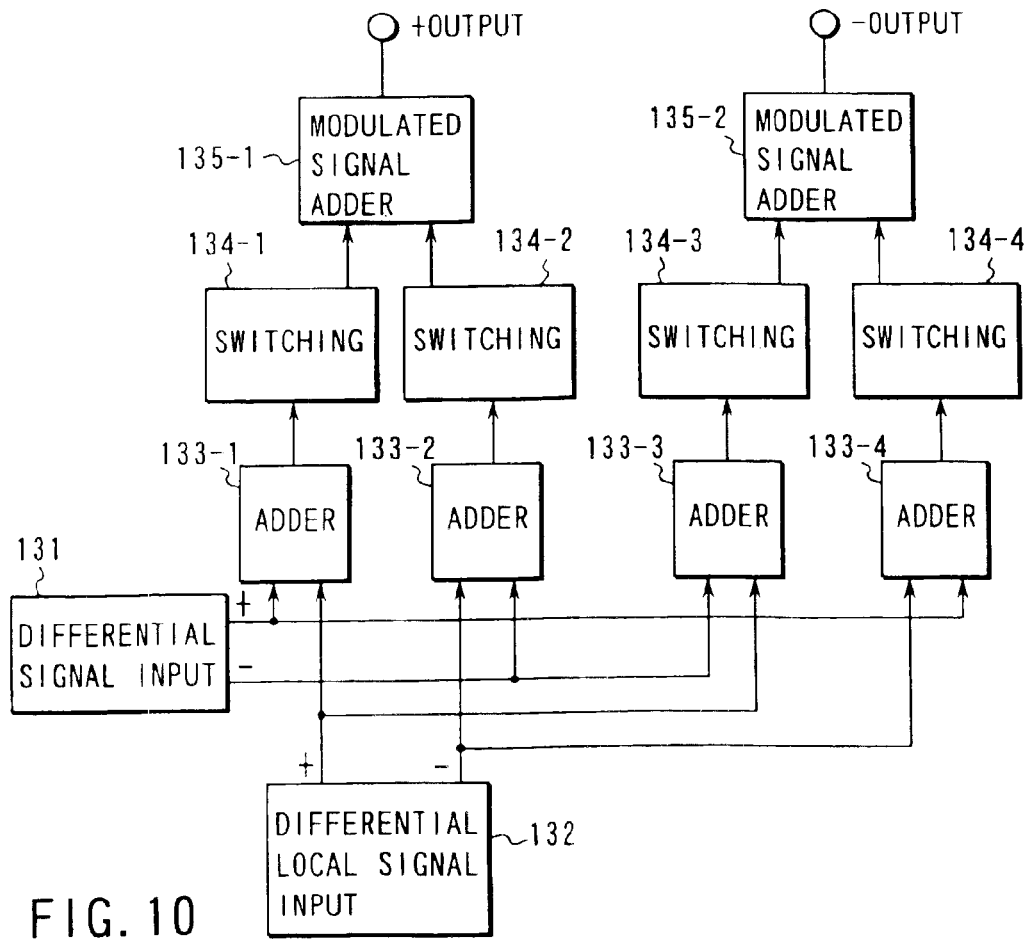
FIG. 10 is a block diagram of a frequency converter according to an eighth embodiment of the present invention.

Reference is now made to FIG. 10 to describe a frequency converter according to an eighth embodiment of the present invention. For example, The frequency converter converts the IF current signal into the RF current signal.

A differential signal input circuit 131 is supplied with IF and IF/current signals which are opposite in phase to each other. A differential local signal input circuit 132 is supplied with LO and LO/current signals which are opposite in phase to each other. The IF current signal is output to signal adders 133-1 and 133-4. The IF/current signal is output to signal adders 133-2 and 133-3.

The LO current signal is output to the signal adders 133-1 and 133-3. The LO/current signal is output to the signal adders 133-2 and 133-4.

The signal adder 133-1 adds the IF current signal and the LO current signal to provide the sum signal to a switching circuit 134-1. The switching circuit 134-1 passes only a portion of the input sum signal which is higher in level than a reference current to one of the inputs of a modulated signal adder 135-1.

The signal adder 133-2 adds the IF/current signal and the LO/current signal to provide the sum signal to a switching circuit 134-2. The switching circuit 134-2 passes only a portion of the input sum signal which is higher in level than the reference current to the other input of the modulated signal adder 135-1.

The modulated signal adder 135-1 adds the outputs of the respective switching circuits 134-1 and 134-2.

The signal adder 133-3 adds the IF/current signal and the LO current signal to provide the sum signal to a switching circuit 134-3. The switching circuit 134-3 passes only a portion of the input sum signal which is higher in level than the reference current to one of the inputs of a modulated signal adder 135-2.

The signal adder 133-4 adds the IF current signal and the LO current signal to provide the sum signal to a switching circuit 134-4. The switching circuit 134-4 passes only a portion of the input sum signal which is higher in level than the reference current to the other input of the modulated signal adder 135-2.

The modulated signal adder 135-2 adds the outputs of the respective switching circuits 134-3 and 134-4. Note here that the reference current value is set to the sum of the bias current of the IF and IF/current signals and the bias current of the LO and LO/current signals.

Figure 11:
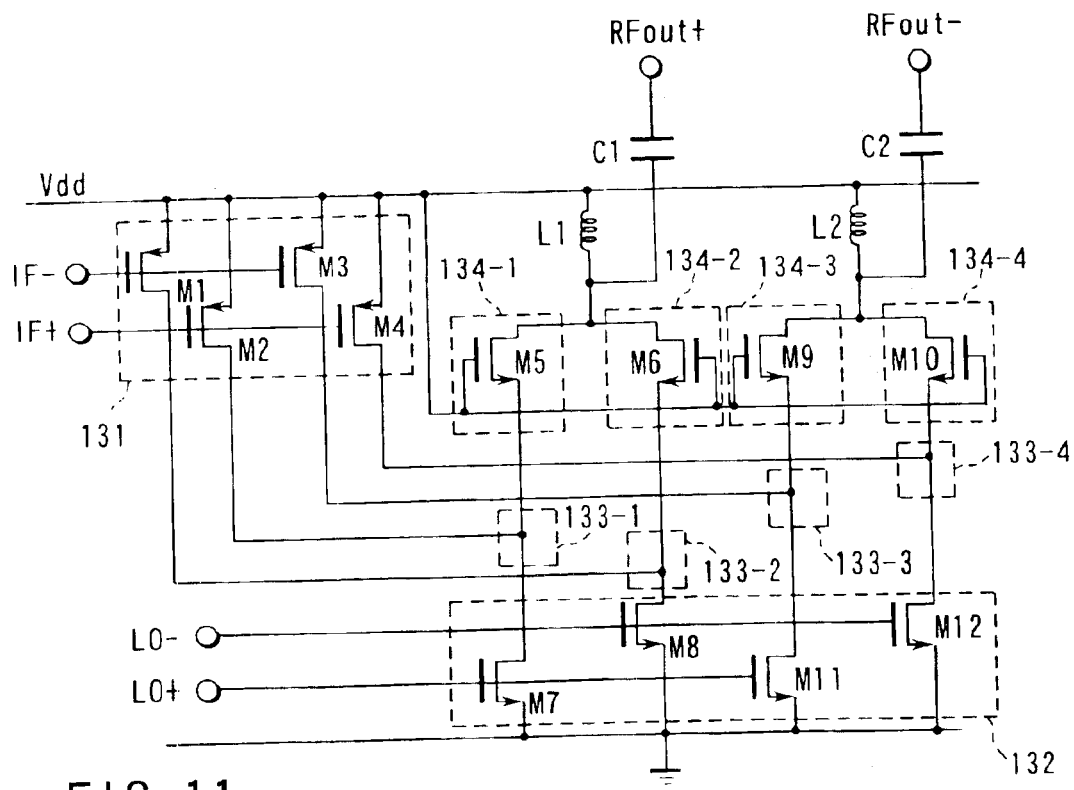
FIG. 11 shows a specific circuit configuration of the frequency converter shown in FIG. 10.

FIG. 11 shows a specific example of the circuit configuration of FIG. 10. That is, the IF current signal is input to transistors M2 and M4. The IF/current signal is input to transistors M1 and M3. The LO current signal is input to transistors M7 and M11. The LO/current signal is input to transistors M8 and M12.

The sum signal of the IF current signal and the LO current signal is input to the transistor M5. The sum signal of the IF/current signal and the LO/current signal is input to the transistor M6. The sum signal of the IF/current signal and the LO current signal is input to the transistor M9. The sum signal of the IF current signal and the LO/current signal is input to the transistor M10.

The output signals of the respective transistors M5 and M6 are added together to provide a first output signal which is taken out through the capacitor C1. The output signals of the respective transistors M9 and M10 are added together to provide a second output signal which is taken out through the capacitor C2.

Thus, the eighth embodiment is little affected by noise that occurs within the local signal amplifier or power supply system because of the differential circuit configuration. That is, a frequency converter can be implemented which has a low noise factor (NF). In our simulation, the noise factor of a single-ended frequency converter was NF=20 dB, whereas the noise factor of a differential frequency converter as in this embodiment was improved to NF=6 dB.

Figure 12:
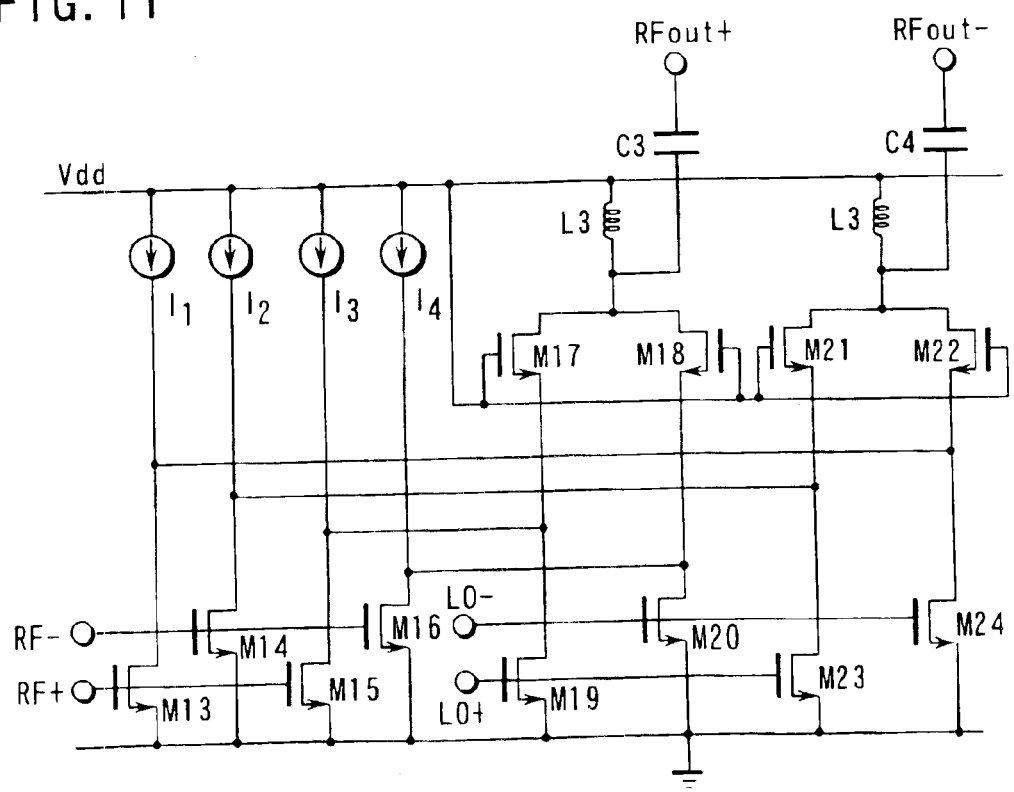
FIG. 12 shows another specific circuit configuration of the frequency converter shown in FIG. 10.

FIG. 12 shows another specific circuit configuration of the frequency converter of FIG. 10. In this configuration, as in the configuration of FIG. 3, transistors M13, M14, M15 and M16 each connected to receive an RF or RF/input are used together with constant current sources. This frequency converter is used as a down-converter taking advantage of the high-frequency characteristic of nMOS transistors.

[Ninth Embodiment]

A frequency converter according to a ninth embodiment of the present invention will now be described with reference to FIG. 13. For example, The frequency converter converts the IF current signal into the RF current signal.

A differential signal input circuit 141 is supplied with IF and IF/differential current signals. A differential signal input circuit 142 is supplied with LO and LO/differential current signals. The IF current signal is output to a signal adder 143-1. The IF/current signal is output to a signal adder 143-2.

The LO current signal is output to the signal adder 143-1. The LO/current signal is output to the signal adder 143-2.

The signal adder 143-1 adds the IF current signal and the LO current signal and then outputs the resulting sum signal to a switching circuit 144-1, which passes only a portion of the input sum signal which is larger in amplitude than a threshold current. The current signal passed through the switching circuit is then applied to a modulated signal adder 145.

The signal adder 143-2 adds the IF/current signal and the LO/current signal and then outputs the resulting sum signal to a switching circuit 144-2, which passes only a portion of the input sum signal which is larger in amplitude than a threshold current for application to the modulated signal adder 145.

A 90-degree phase shifted differential signal input circuit 146 is supplied with 90-degree phase shifted IF and IF/differential current signals. A 90-degree phase-shifted differential signal input circuit 147 is supplied with 90-degree phase-shifted LO and LO/differential current signals. The phase-shifted IF current signal is output to a signal adder 148-1. The phase-shifted IF/current signal is output to a signal adder 148-2.

The phase-shifted LO current signal is output to the signal adder 148-1. The phase-shifted IF/current signal is output to the signal adder 148-2.

The signal adder 148-1 adds the phase-shifted IF current signal and the phase-shifted LO current signal and then outputs the resulting sum signal to a switching circuit 149-1, which passes only a portion of the input sum signal which is larger in magnitude than a threshold current. The current signal passed through the switching circuit is then applied to the modulated signal adder 145.

The signal adder 148-2 adds the phase-shifted IF/current signal and the phase-shifted LO/current signal and then outputs the resulting sum signal to a switching circuit 149-2, which passes only a portion of the input sum signal which is larger in magnitude than a threshold current for application to the modulated signal adder 145.

The modulated signal adder 145 adds the outputs of the respective switching circuits 144-1, 144-2, 144-3 and 144-4 to provide an output current signal. Note here that the reference current value is set to the sum of the bias current of the IF and IF/current signals and the bias current of the LO and LO/current signals.

Figure 13:
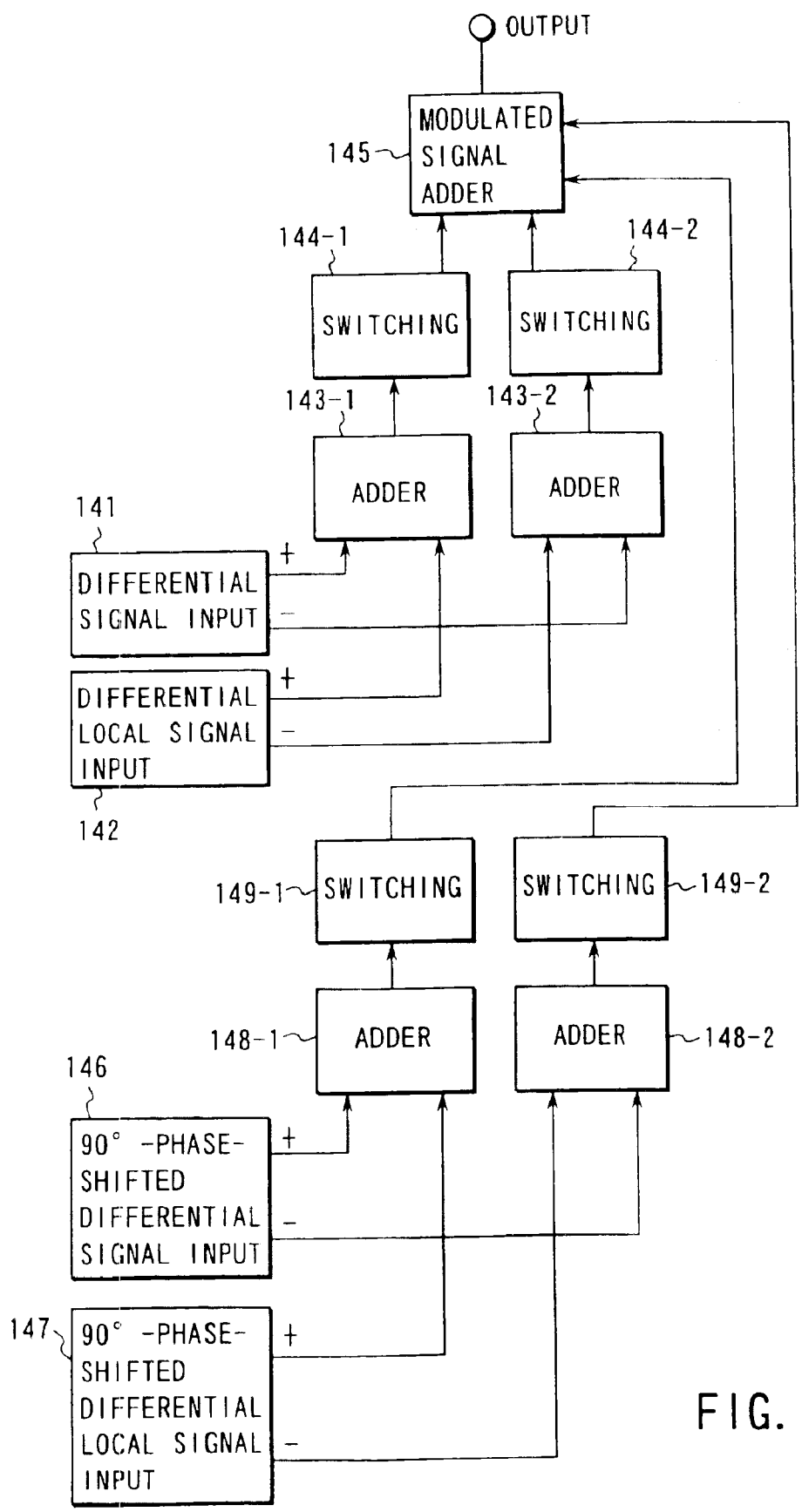
FIG. 13 is a block diagram of a frequency converter according to a ninth embodiment of the present invention.
Figure 14:
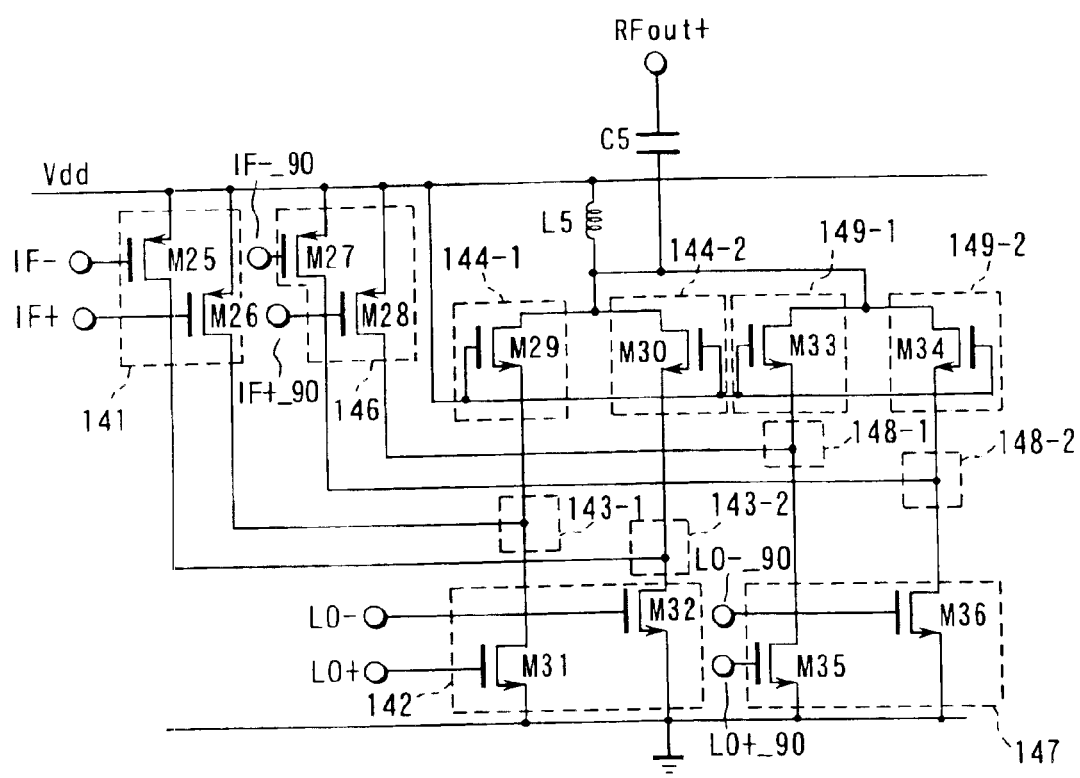
FIG. 14 shows a specific circuit configuration of the frequency converter shown in FIG. 13.

FIG. 14 shows a specific example of the circuit configuration of FIG. 13. That is, the IF current signal is input to the transistor M26. The IF/current signal is input to the transistor M25. The 90-degree phase-shifted IF current signal is input to the transistor M28. The 90-degree phase-shifted IF/current signal is input to the transistor M27.

The LO current signal is input to the transistor M31. The LO/current signal is input to the transistor M32. The 90-degree phase-shifted LO current signal is input to the transistor M35. The 90-degree phase-shifted LO/current signal is input to the transistor M36. The current signals of the respective transistors M26 and M31 are added together and then switched by the transistor M29. The current signals of the respective transistors M25 and M32 are added together and then switched by the transistor M30. The current signals of the respective transistors M28 and M35 are added together and then switched by the transistor M33. The current signals of the respective transistors M27 and M36 are added together and then switched by the transistor M34. The outputs of the respective transistors M29, M30, M33 and M34 are added together to produce an output signal.

Here, the operation of the frequency converter thus configured will be described.

Assume that the IF current signal input to the differential IF signal input circuit 141 is is1=A sin $\omega_S t$ and the LO current signal input to the differential LO signal input circuit 142 is iL1=B sin $\omega_L t$. Then, the sum current signal io1 from the signal adder 143-1 is represented by $i01=D \cos(\omega_S+\omega_L)t - D \cos(\omega_S-\omega_L)t$ where D is a constant and $(\omega_S-\omega_L)$ is the image frequency.

The sum current signal io2 from the signal adder 143-2 is represented by $i02=-D \cos(\omega_S+\omega_L)t + D \cos(\omega_S-\omega_L)t$ Assume that the IF current signal input to the 90-degree phase-shifted differential IF signal input circuit 146 is is3=A cos $\omega_S t$ and the LO current signal input to the 90-degree phase-shifted differential LO signal input circuit 147 is iL3=B cos $\omega_L t$. Then, the sum current signal io3 from the signal adder 148-1 is represented by $i03=D \cos(\omega_S+\omega_L)t + D \cos(\omega_S-\omega_L)t$ The sum current signal io4 from the signal adder 148-2 is represented by $i04=-D \cos(\omega_S+\omega_L)t - D \cos(\omega_S-\omega_L)t$ The addition of these sum current signals io1, io2, io3 and io4 leads to E cos $(\omega_S+\omega_L)t$. Thus, the image frequency $(\omega_S-\omega_L)$ becomes eliminated.

As described above, the ninth embodiment allows the image signal resulting from frequency conversion to be removed because input signals between which a phase shift of 90 degrees has been introduced are added together after frequency conversion.

[Tenth Embodiment]

Figure 15:
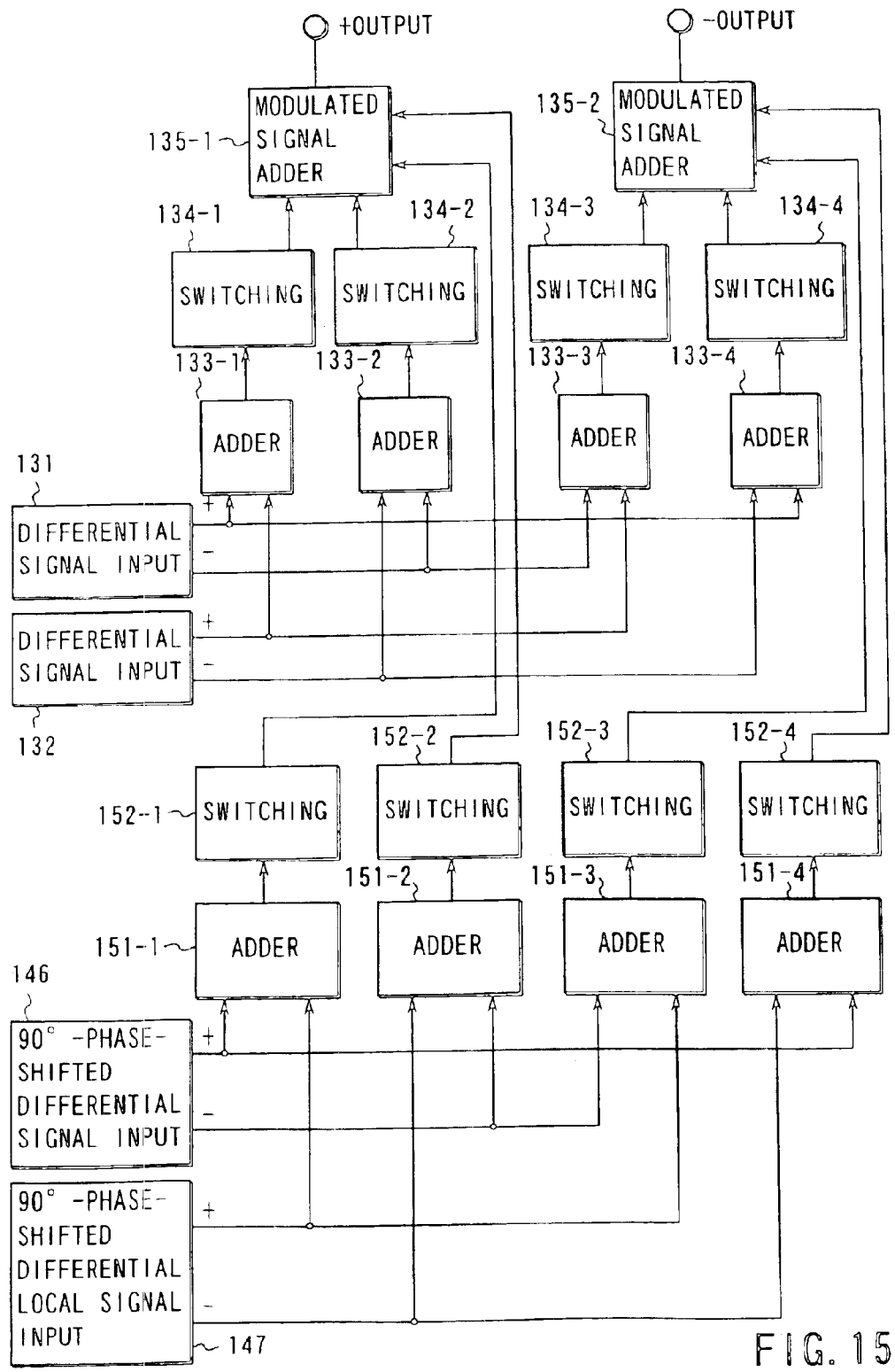
FIG. 15 is a block diagram of a frequency converter according to a tenth embodiment of the present invention.
Figure 16:
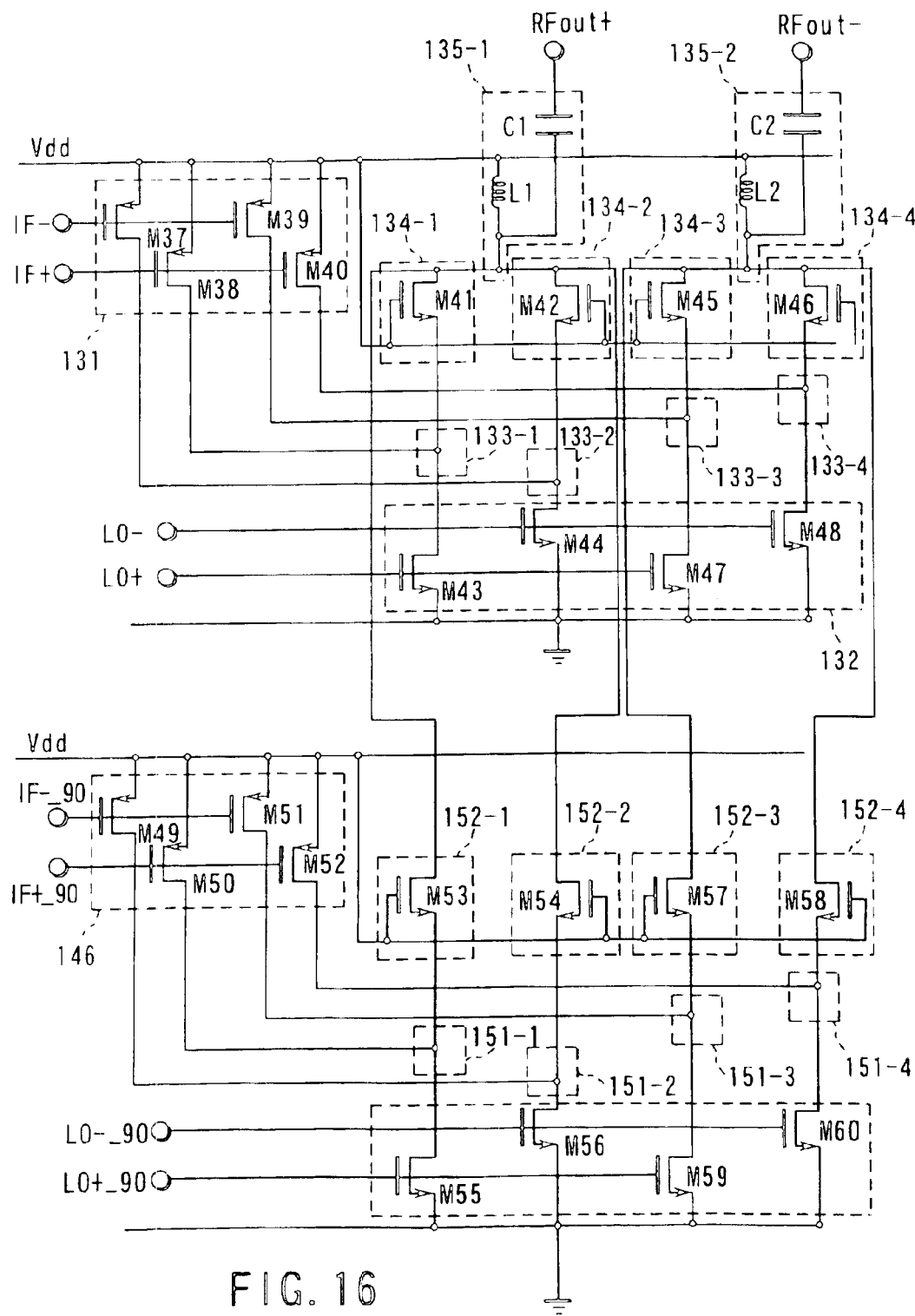
FIG. 16 shows a specific circuit configuration of the frequency converter shown in FIG. 15.

Reference is now made to FIG. 15 to describe a frequency converter according to a tenth embodiment of the present invention. For example, The frequency converter converts the IF current signal into the RF current signal. FIG. 16 shows a specific circuit configuration of the frequency converter of FIG. 15. In FIG. 15, components corresponding to those in FIGS. 10 and 13 are denoted by like reference numerals and detailed descriptions thereof are omitted.

The phase-shifted IF current signal is output to signal adders 151-1 and 151-3. The phase-shifted IF/current signal is output to signal adders 151-2 and 151-4.

The phase-shifted LO current signal is output to the signal adders 151-1 and 151-3. The phase-shifted LO/current signal is output to the signal adders 151-2 and 151-4.

The signal adder 151-1 adds the phase-shifted IF current signal and the phase-shifted LO current signal and then outputs the resulting sum signal to a switching circuit 152-1. This switching circuit passes only a portion of the input sum signal which is larger in amplitude than a threshold current. The current signal passed through the switching circuit is then applied to a modulated signal adder 135-1.

The signal adder 151-2 adds the phase-shifted IF/current signal and the phase-shifted LO/current signal and then outputs the resulting sum signal to a switching circuit 152-2, which passes only a portion of the input sum signal which is larger in amplitude than a threshold current for application to the modulated signal adder 135-1.

The modulated signal adder 135-1 adds the outputs of the respective switching circuits 134-1, 134-2, 152-1 and 152-2 to provide a first output current signal.

The signal adder 151-3 adds the phase-shifted IF/current signal and the phase-shifted LO current signal and then outputs the resulting sum signal to a switching circuit 152-3. This switching circuit passes only a portion of the input sum signal which is larger in magnitude than a threshold current. The current signal passed through the switching circuit is then applied to a modulated signal adder 135-2.

The signal adder 151-4 adds the phase-shifted IF current signal and the phase-shifted LO/current signal and then outputs the resulting sum signal to a switching circuit 152-4, which passes only a portion of the input sum signal which is larger in amplitude than a threshold current for application to the modulated signal adder 135-2.

The modulated signal adder 135-2 adds the outputs of the respective switching circuits 134-3, 134-4, 152-3 and 152-4 to provide a second output current signal. The second output current signal is opposite in phase to the first output current signal. Note here that the reference current value is set to the sum of the bias current of the IF and IF/current signals and the bias current of the LO and LO/current signals.

Thus, the frequency converter of the tenth embodiment suffers little from noise that occurs within the local signal amplifier or power supply system because the differential circuit configuration is used to process simultaneously signals between which a phase shift of 90 degrees has been introduced. That is, a low-noise frequency converter can be implemented.

Moreover, the tenth embodiment allows the image signal resulting from frequency conversion to be removed because input signals between which a phase shift of 90 degrees has been introduced are added together after frequency conversion.

[Other Embodiments]

Although the preferred embodiments of the present invention have been disclosed and described, it is apparent that other embodiments and modifications are possible.

For example, bipolar transistors may be used instead of MOS transistors. To use a bipolar transistor in the switching circuit 104 in FIG. 3, it is simply connected in such a way that its base is grounded with respect to high-frequency currents, its emitter is connected to the signal adder 103, and its collector is connected to the signal output circuit 105. In addition, it is desired that its base-to-emitter voltage be set substantially equal to the ON voltage.

As the current signal to which reference is made, other than the local (LO) current signal may be used.

What is claimed is:

1. A frequency converter which converts a first current signal having a first frequency into a second current signal having a second frequency different from the first frequency, comprising:

adding means for adding the first current signal and a reference current signal to output a third current signal;

passing means for passing a larger current component of the third current signal to obtain the second current signal, when the third current signal includes the larger current component which is larger in magnitude than a threshold current, and blocking a smaller current component of the third current signal, when the third current signal includes the smaller current component which is smaller in magnitude than the threshold current; and a constant current source which generates the threshold current.

2. A frequency converter which converts a first current signal having a first frequency into a second current signal having a second frequency different from the first frequency, comprising:

first adding means for adding the first current signal and a reference current signal to output a third current signal;

second adding means for adding a first antiphase current signal opposite in phase to the first current signal and a second antiphase current signal opposite in phase to the reference current signal to output a fourth current signal;

first current outputting means for passing only a current component of the third current signal to output a first passed current signal, when the third current signal includes the current component which is larger in magnitude than a first threshold current;

second current output means for passing only a current component of the fourth current signal to output a second passed current signal, when the fourth current signal includes the current component which is larger in magnitude than a second threshold current; and third adding means for adding the first passed current signal and the second passed current signal to output the second current signal.

3. A frequency converter which converts a first current signal having a first frequency into a second current signal having a second frequency different from the first frequency, comprising:

first adding means for adding the first current signal and a reference current signal to output a third current signal;

second adding means for adding a first antiphase current signal opposite in phase to the first current signal and a second antiphase current signal opposite in phase to the reference current signal to output a fourth current signal;

third adding means for adding a first phase-shifted current signal obtained by shifting a phase of the first current signal by 90 degrees and a second phase-shifted current signal obtained by shifting a phase of the reference current signal by 90 degrees to output a fifth current signal;

fourth adding means for adding a third phase-shifted current signal obtained by shifting the phase of the first current signal by 270 degrees and a fourth phase-shifted current signal obtained by shifting the phase of the reference current signal by 270 degrees to output a sixth current signal;

first current outputting means for passing only a current component of the third current signal to output a first passed current signal, when the third current signal includes the current component which is larger in magnitude than a first threshold current;

second current outputting means for passing only a current component of the fourth current signal to output a second passed current signal, when the fourth current signal includes the current component which is larger in magnitude than a second threshold current;

third current outputting means for passing only a current component of the fifth current signal which is larger in magnitude than a third threshold current to output a third passed current signal, when the fifth current signal includes the current component which is larger in magnitude than a third threshold current;

fourth current outputting means for passing only the current component of the sixth current signal to output a fourth passed current signal, when the sixth current signal includes the current component which is larger in magnitude than a fourth threshold current;

fifth adding means for adding the first passed current signal, the second passed current signal, the third passed current signal, and the fourth passed current signal to output the second current signal;

sixth adding means for adding the first current signal and the second antiphase current signal to output a seventh current signal;

seventh adding means for adding the first antiphase current signal and the reference current signal to output an eighth current signal;

eighth adding means for adding the first phase-shifted current signal and the fourth phase-shifted current signal to output a ninth current signal;

ninth adding means for adding the second phase-shifted current signal and the third phase-shifted current signal to output a tenth current signal;

fifth current outputting means for passing only a current component of the seventh current signal to output a fifth passed current signal, when the seventh current signal includes the current component which is larger in magnitude than a fifth threshold current;

sixth current outputting means for passing only a current component of the eighth current signal to output a sixth passed current signal, when the eighth current signal includes the current component which is larger in magnitude than a sixth threshold current;

seventh current outputting means for passing only a current component of the ninth current signal to output a seventh passed current signal, when the ninth current signal includes the current component which is larger in magnitude than a seventh threshold current;

eighth current outputting means for passing only a current component of the tenth current signal to output an eighth passed current signal, when the tenth current signal includes the current component which is larger in magnitude than a eighth threshold current; and tenth adding means for adding the fifth passed current signal, the sixth passed current signal, the seventh passed current signal, and the eighth passed current signal to output a third antiphase current signal opposite in phase to the second current signal.

4. A frequency converter which converts a first current signal having a first frequency into a second current signal having a second frequency different from the first frequency, comprising:

adding means adding the first current signal and a reference current signal to output a third current signal;

a field effect transistor which includes a gate terminal which is grounded for radio-frequency currents, pass only a current component of the third current signal to obtain the second current signal, when the third current signal includes the current component which is larger in magnitude than a threshold current; and a constant current source which is connected to a source terminal of the field effect transistor, and generates a current substantially equal in magnitude to the threshold current.

* * * * *

UNITED STATES PATENT AND TRADEMARK OFFICE
CERTIFICATE OF CORRECTION

PATENT NO. : 6,954,089 B2  Page 1 of 1
DATED : October 11, 2005
INVENTOR(S) : Umeda et al.

It is certified that error appears in the above-identified patent and that said Letters Patent is hereby corrected as shown below:

<u>Title page,</u>
Item [45] and [*] Notice should read as follows:
-- [45] **Date of Patent: *Oct. 11, 2005**
[*] Notice: Subject to any disclaimer, the term of this
 patent is extended or adjusted under 35
 U.S.C. 154(b) by 0 days.

This patent is subject to a terminal disclaimer. --.

Signed and Sealed this

Thirteenth Day of December, 2005

JON W. DUDAS
*Director of the United States Patent and Trademark Office*